United States Patent
Furman et al.

(10) Patent No.: US 10,873,836 B2
(45) Date of Patent: Dec. 22, 2020

(54) EFFICIENT SHORT MESSAGE COMPRESSION

(71) Applicant: Harris Global Communications, Inc., Rochester, NY (US)

(72) Inventors: William N. Furman, Fairport, NY (US); John W. Nieto, Rochester, NY (US); Michael A. Wadsworth, Palmyra, NY (US)

(73) Assignee: HARRIS GLOBAL COMMUNICATIONS, INC., Rochester, NY (US)

( * ) Notice: Subject to any disclaimer, the term of this patent is extended or adjusted under 35 U.S.C. 154(b) by 0 days.

(21) Appl. No.: 16/685,860

(22) Filed: Nov. 15, 2019

(65) Prior Publication Data

US 2020/0084596 A1    Mar. 12, 2020

Related U.S. Application Data

(62) Division of application No. 16/019,943, filed on Jun. 27, 2018, now Pat. No. 10,506,388.

(51) Int. Cl.
*H04W 4/14* (2009.01)
*H04L 1/00* (2006.01)
(Continued)

(52) U.S. Cl.
CPC ............ *H04W 4/14* (2013.01); *H04L 1/0061* (2013.01); *H04L 69/04* (2013.01); *H04W 28/04* (2013.01)

(58) Field of Classification Search
CPC ...... H04W 4/14; H04W 28/04; H04L 1/0061; H04L 69/04
(Continued)

(56) References Cited

U.S. PATENT DOCUMENTS 4,876,541 A    10/1989   Storer
5,715,468 A     2/1998   Budzinski
(Continued)

FOREIGN PATENT DOCUMENTS

EP       1605595 A1    12/2005

OTHER PUBLICATIONS

Patil, M., et al., "A Survey of Compression and Encryption Techniques for SMS," International Journal of Advancements in Research & Technology, v. 2, May 15, 2013, copyright 2013 SciResPub.
(Continued)

*Primary Examiner* — Nghi H Ly
(74) *Attorney, Agent, or Firm* — Fox Rothschild LLP; Robert J. Sacco; Carol E. Thorstad-Forsyth

(57) ABSTRACT

A method for compressing a short message includes receiving a short message that includes a plurality of text strings for compression, dividing the short message into one or more sub-blocks, where a number of text strings in each of the one or more sub-blocks is less than or equal to a predetermined number. The method also includes compressing each of the one or more sub-blocks by identifying a type of a first text string, identifying a code representing the type, determining whether the first text string exists in a library, upon determining that the first text string exists in the library, determining an index corresponding to the first text string, extracting a predetermined number of least significant digits of the index, and replacing the first text string in that sub-block with the code and the extracted predetermined number of least significant digits of the index.

6 Claims, 7 Drawing Sheets

(51) Int. Cl.
*H04W 28/04* (2009.01)
*H04L 29/06* (2006.01)

(58) Field of Classification Search
USPC .......... 455/466, 410, 411, 412.1, 414.1, 423
See application file for complete search history.

(56) References Cited

U.S. PATENT DOCUMENTS

| | | | |
|---|---|---|---|
| 6,122,402 A | 9/2000 | Arai et al. | |
| 7,647,552 B2 | 1/2010 | Wan | |
| 8,676,122 B2* | 3/2014 | Piesinger | H04W 12/0013 455/41.2 |
| 9,894,421 B2 | 2/2018 | Dao et al. | |
| 2003/0233478 A1* | 12/2003 | Chuah | H04L 29/06 709/247 |
| 2006/0270425 A1 | 11/2006 | Lee | |
| 2008/0147801 A1 | 6/2008 | Foti | |
| 2009/0042589 A1* | 2/2009 | Park | H04M 1/72552 455/466 |
| 2009/0112897 A1 | 4/2009 | Ordentlich et al. | |
| 2010/0146296 A1 | 6/2010 | Kim et al. | |
| 2010/0192048 A1 | 7/2010 | Washio et al. | |
| 2013/0086339 A1 | 4/2013 | Pardo et al. | |
| 2013/0173248 A1 | 7/2013 | Curzi et al. | |
| 2014/0122408 A1 | 5/2014 | Li et al. | |
| 2014/0349691 A1* | 11/2014 | Kumar | H04W 4/14 455/466 |
| 2016/0119266 A1 | 4/2016 | Krishnamurthy | |
| 2017/0093764 A1 | 3/2017 | Hunt et al. | |
| 2017/0329619 A1 | 11/2017 | Craik et al. | |

OTHER PUBLICATIONS

Lu, W., et al., "A Fast-Adaptive Huffman Coding Algorithm," IEEE Transactions on Communications. vol. 41, No. 4, Apr. 1993.

Kalajdzic, K., et al., "Rapid Lossless Compression of Short Text Messages," Computer Standards & Interfaces 37 (2015) 53-59.

Islam, R., et al., "An Enhanced Scheme for Lossless Compression of Short Text for Resource Constrained Devices," Proceedings of the 14th International Conference on Computer and Information Technology (ICCIT 2011), Dec. 22-24, 2011, Dhaka, Bangladesh, 987-161284-908-9/11 copyright 2011 IEEE.

Gardner-Stephen, P., et al., "Improving Compression of Short Messages," International Journal of Communications, Network and System Sciences, 2013, 6, 497-504, Scientific Research, published online Dec. 2013 (http://www.scirp.org/journal/ijcns)http://dx.doi.org/10.4236/ijcns.2013.612053.

* cited by examiner

| Field | NumBits | Description | Position |
|---|---|---|---|
| Word Cnt | 3 | number words to follow | 1 |
| CRC Type/Size | 2 | Size of CRC used | 2 |
| CRC | 8,16,24,32 | Calculated CRC | 3 |
| Word Type | 3 | Word is All Cap (Code: 101) | Before Word Index |
| | 3 | Word is 1st Cap (Code:100) | |
| | 3 | Word is plural (Code: 000) | |
| | 3 | Word not in Library (Code: 111) | |
| Word Index | 10 | LSB Library Index | |

FIG. 3

EFFICIENT SHORT MESSAGE COMPRESSION

CROSS REFERENCE TO RELATED APPLICATIONS

This application is a divisional application and claims priority to U.S. patent application Ser. No. 16/019,943 entitled "EFFICIENT SHORT MESSAGE COMPRESSION" filed on Jun. 27, 2018, the contents of which is incorporated herewith in its entirety

BACKGROUND

Statement of the Technical Field

The technical field of this disclosure generally relates to data communication networks. In particular, the present disclosure relates to methods and systems for compression of short messages for communication between computing devices and subsequent reconstruction.

Description of the Related Art

One kind of communications network is a tactical data network or a tactical communications network that may be utilized by units within an organization such as a military (e.g., army, navy, and/or air force) for communicating data such as text, voice, position telemetry, sensor data, and/or real-time video. Nodes within a tactical data network may include, for example, individual soldiers, aircraft, command units, satellites, and/or radios. Such tactical data networks are generally bandwidth-constrained. That is, there is typically more data to be communicated than bandwidth available at any given point in time. In addition to bandwidth constraints, tactical data networks may experience high latency.

Short messages are typically used in such tactical data networks to conserve bandwidth usage. The importance of short messages increases as the communication links between nodes become more challenging due to bandwidth constraints of links, wave propagation, distance (e.g., if a node moves out of range), intentional or unintentional jamming of a node, interference from other signals or networks, or the like, leading to data loss. Short messages may also be used in other forms of communication networks (e.g., for sending short message service (SMS) messages, Twitter messages or the like).

Short messages are short text strings that include a limited number of characters based, for example, on the constraints of the communication protocol or network used for transmission of the message. For example, a typical SMS message conveyed over a cellular network can be limited to 160 7-bit characters, a short message conveyed over a tactical network can be about 10-180 characters long. Data in a short message may be sent in a compressed or uncompressed form. Compression may maximize transmission capacity, minimize network load, reduce errors due to degradation of a communication link, and overcome latency related constraints.

Data compression systems are known in the prior art that compress a stream of digital data signals (uncompressed bits) into compressed digital data signals (compressed bits), which require less bandwidth (fewer bits) than the original digital data signals, and that reconstruct the compressed digital data signals back into the original data signals or a close approximation thereof. Lossless data compression systems reconstruct the compressed digital data signals back into the original data signals exactly.

Typical compression algorithms identify patterns in the codes they read, and then exploit the identified patterns by creating a dynamic dictionary that is used to express subsequent occurrences of the patterns in the codes more compactly. For example, dictionary-based compression, exploits the property of many data types to contain repeating sequences of characters. Good examples of such data are text files (a sequence of alphanumeric characters) and raster images (a sequence of pixels). Dictionary-based compression methods exploit this tendency to include repeating character sequences by replacing substrings in a data stream with a code word that identifies that substring in a dictionary. This dictionary can be static if knowledge of the input stream and statistics are known, or it can be adaptive.

This approach, while useful for long sequences, provides limited value for short messages. Most lossless data compression algorithms, such as the PKZIP compression and Huffman coding methods and their many variants, yield poor results when used with short code sequences because the encoded output contains more bits than were present in the original sequence, resulting in either expansion, not compression, of the short messages and/or inefficient compression.

SUMMARY

This document concerns a system and method for compression of short messages. The system is comprised of a processor and a computer-readable storage medium comprising one or more programming instructions. The system is configured to receive a short message that includes a plurality of text strings. The system may compress the received short message by dividing the short message into one or more sub-blocks and compressing each of the one or more sub-blocks. The number of text strings in each of the one or more sub-blocks is less than or equal to a predetermined number. The system may compress each sub-block by identifying a type of a first text string, identifying a code representing the type, determining whether the first text string exists in a library, determining a library index corresponding to the first text string (if the first text string exists in the library), extracting a predetermined number of least significant digits of the index, and replacing the first text string in the sub-block with the code and the extracted predetermined number of least significant digits of the index. However, if the system determines that the first text string does not exist in the library, the system may replace the first text string with a second code representing that the first text string does not exist in the library and an encoded format of the first text string suitable for transmission of the short message over a communications network. The system may repeat the foregoing steps until all the text strings of the sub-block being compressed have been processed.

For each sub-block, the system may also calculate a first cyclic redundancy check code (CRC code) of a first length based on that sub-block, verify the first CRC code to determine whether the first CRC code leads to correct reconstruction of a compressed sub-block corresponding to that sub-block, and append the first length and the first CRC code to a partial compressed sub-clock corresponding to that sub-block to create a CRC compressed sub-block. If the first CRC code leads to correct reconstruction of the compressed sub-block corresponding to that sub-block. However, if the first CRC code does not lead to correct reconstruction of the compressed sub-block corresponding to that sub-block, the system may calculate a second CRC code of a second length, verify the second CRC code to determine whether the second CRC code leads to correct reconstruction of a compressed sub-block corresponding to that sub-bloc, and append the second length and the second CRC code to a partial compressed sub-clock corresponding to that sub-block to create a CRC compressed sub-block if the second CRC code leads to correct reconstruction of the compressed sub-block corresponding to that sub-block. The first length may be less than the second length. The first and second lengths may be 8-bits, 16-bits, 24-bits and/or 32-bits. Optionally, the system may also append to the CRC compressed sub-block a number of words in sub-block being processed to create a compressed sub-block.

The first text string may be a string of characters between two character spaces. In an embodiment, the predetermined number of text strings may be 7. In another embodiment, the predetermined number of least significant bits may be 10.

The type may correspond to one or more characteristics of the text string being processed such as, for example, all capital letters in a text string, a leading capital letter in a text string, different fonts of a text string, a plural form of a text string, a singular form of a text string, exclamation or other punctuation appended to a text string, tense of a text string, and/or one or more grammatical constructs.

The library may include a plurality of text strings and a plurality of indexes that each represent a relative position of a text string in the library.

This document concerns a system and method for reconstruction of compressed short messages. The system is comprised of a processor and a computer-readable storage medium comprising one or more programming instructions. The system is configured to receive a compressed short message that includes a plurality of fields. The system may reconstruct the received compressed short message by dividing the compressed short message into one or more sub-blocks and reconstructing each sub-block by first identifying positions of a number of text strings field, a cyclic redundancy check (CRC) code length field, and a CRC code field in that sub-block. The system may then extract, from the sub-block, the CRC code length and the number of words (m) based on the identified positions, the CRC code, and a first code representing a text string type of a text string following the first code. The system may analyze the first code to determine whether the text string was compressed using a library, extract a predetermined number of least significant bits representative of an index corresponding to the text string in the library if the text string was compressed using a library, using the CRC code to determine the index, and using the index to replace the predetermined number of least significant bits representative of the index in that sub-block with the text string. However, if the text string was not compressed using a library, the system may identify a number of characters in the text string and decoding the text string. The system may repeat the reconstruction steps "m" number of times to create a reconstructed message.

BRIEF DESCRIPTION OF THE DRAWINGS

This disclosure is facilitated by reference to the following drawing figures, in which like numerals represent like items throughout the figures, and in which:

FIG. 3 illustrates an example rule set used for compression and reconstruction of a short message, according to an embodiment.

DETAILED DESCRIPTION

Figure 1:
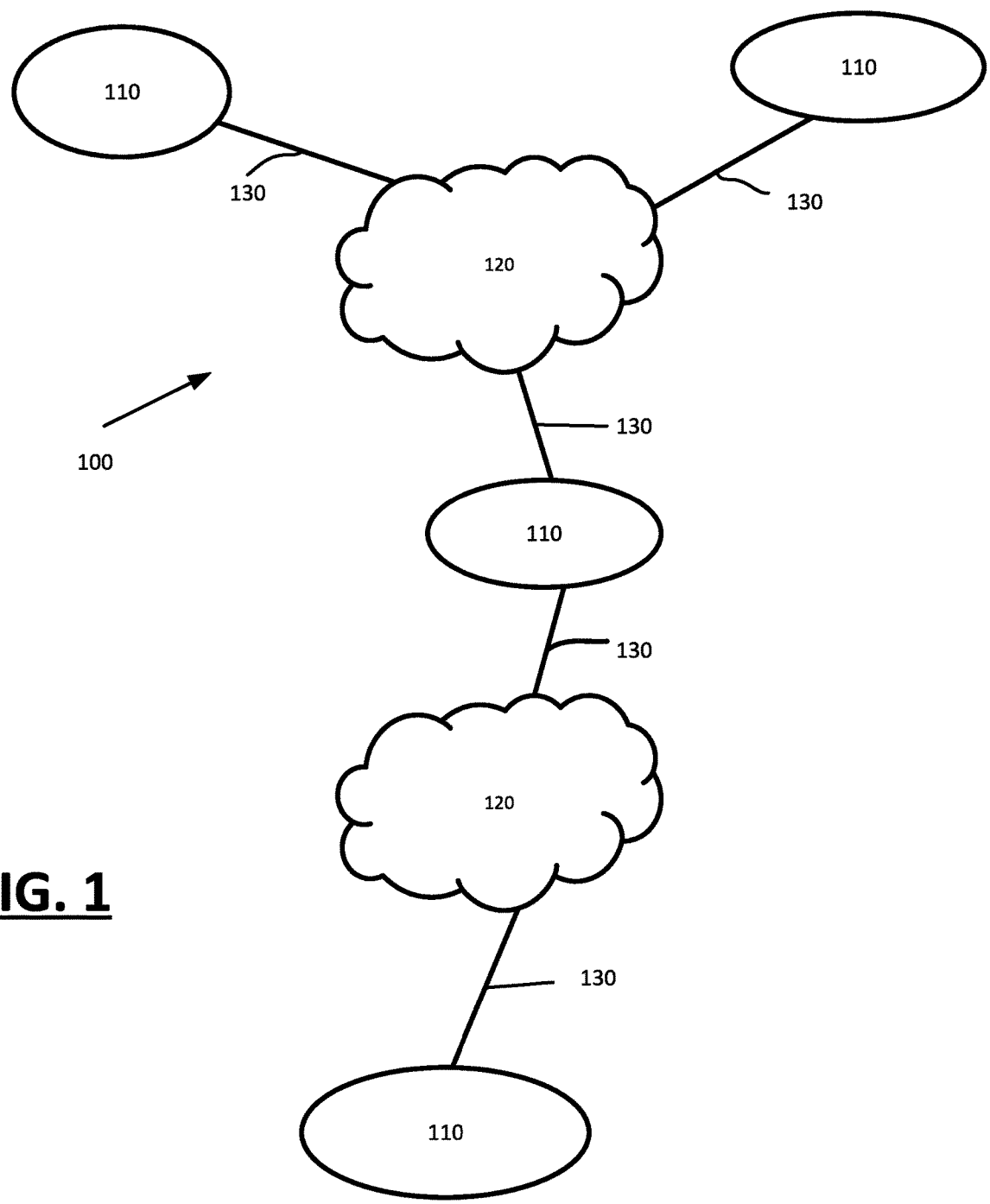
FIG. 1 illustrates a schematic illustration of a communications network environment that includes the messaging system, according to an embodiment

It will be readily understood that the components of the systems and/or methods as generally described herein and illustrated in the appended figures could be arranged and designed in a wide variety of different configurations. Thus, the following more detailed description, as represented in the figures, is not intended to limit the scope of the present disclosure, but is merely representative of certain implementations in various different scenarios. While the various aspects are presented in the drawings, the drawings are not necessarily drawn to scale unless specifically indicated.

The methods and/or systems disclosed herein may provide certain advantages in a communication network, by compressing messages transmitted over the communication network. According to one aspect, the performance of such networks is enhanced by improving bandwidth utilization and decreasing the latency.

FIG. 1 illustrates a schematic illustration of a communications network environment 100 that includes the messaging system of the current disclosure. The network environment 100 includes a plurality of communication nodes 110, one or more networks 120, and one or more links 130 connecting the nodes and network(s). The following discussion assumes a network environment 100 including more than one network 120 and more than one link 130, but it should be understood that other environments are possible and anticipated.

Communication nodes 110 may be and/or may include electronic devices that include wired or wireless data communication components and may exchange electronic messages with one another over a data communication network. Examples may include, without limitation, radios, transmitters, satellites, mobile devices, receivers, workstations, servers, and/or other computing or processing devices. Example wireless data communication components can include, e.g. mobile phone transceivers, WiFi transceivers, military radio transceivers, and the like.

Network(s) 120 is a data communication network that includes hardware and/or software for transmitting data between nodes 110 such as, for example, the Internet, cellular networks, local area networks (LAN), wide area networks (WAN), or the like. Network(s) 120 may include the one or more nodes 110. Link(s) 130 may be wired and/or wireless connections to allow transmission of data between nodes 110 and/or network(s) 120 such as, without limitation, a wire, cable, fiber optic link, bus, computer backplane, wide or local area network, public or private Internet, satellite, wireless connection, or another suitable construct for exchanging digital data communications. Communications over the link(s) 130 may use any suitable protocol, such as TCP/IP, Ethernet, etc.

Figure 2:
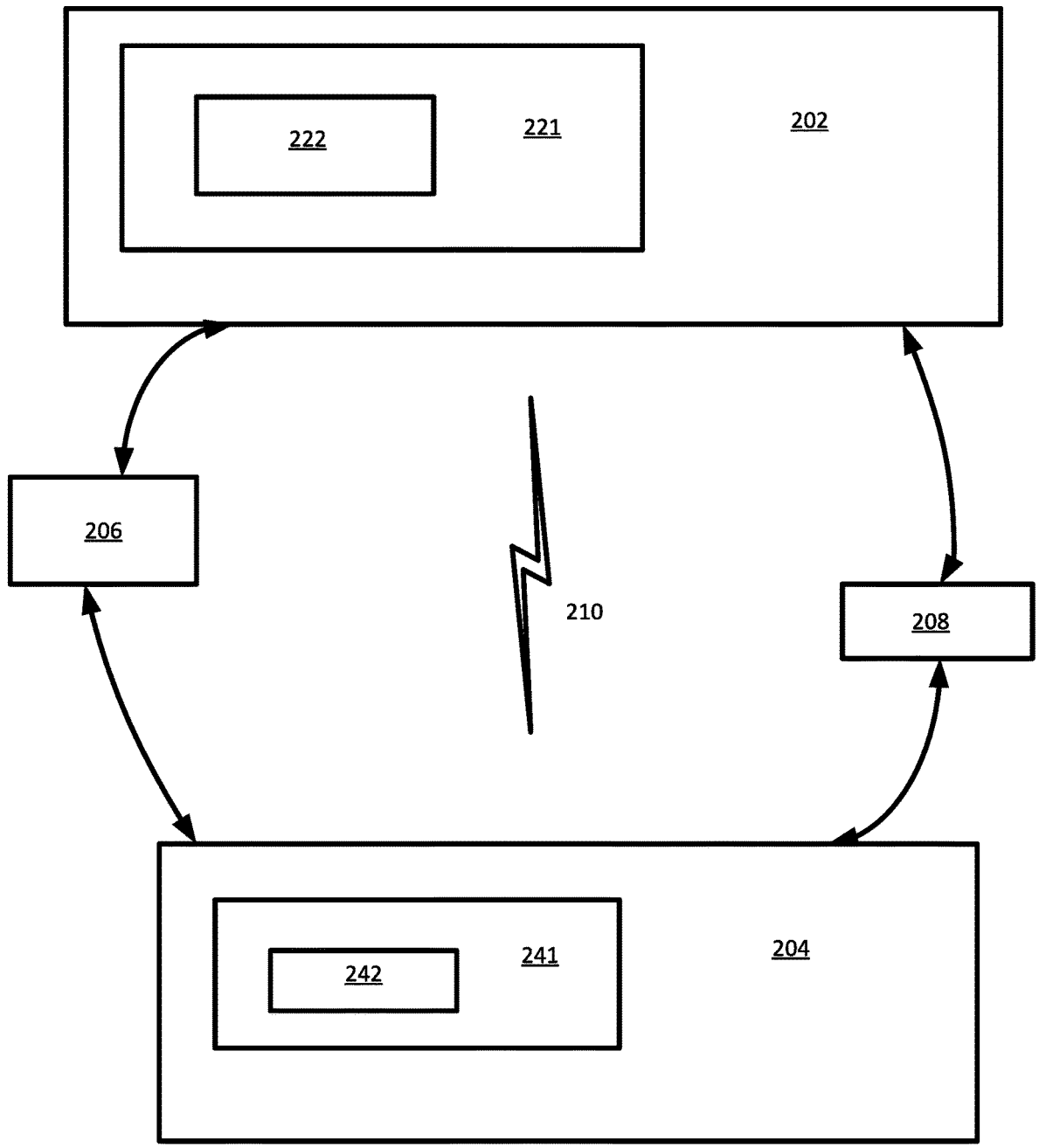
FIG. 2 illustrates a schematic representation of a messaging system, according an embodiment.

FIG. 2 illustrates a schematic representation of a messaging system 200 according an embodiment of the current disclosure. The messaging system 200 includes a sending device 202 and a receiving device 204 (nodes 110 of the network environment 100) communicably connected via a communications link 210.

In an embodiment, the sending device 202 receives a text message from a user (e.g., via a user interface) of the sending device 202 for transmission to the receiving device 204 via the communications link 210. The received text message may include characters such as, without limitation, alphanumeric characters, spaces, and punctuation. Typically, uncompressed messages may be transmitted over the communication link in a bit format (e.g., 7-bit ASCII representation of each character). For example, an uncompressed 20 character message will include 140 bits.

According to one or more embodiments of the current disclosure, a compression module 221 of the sending device 202 may compress a text message in accordance with the methods described in this disclosure before transmission. In an embodiment, a reconstruction module 241 of the receiving device 204 may reconstruct the received message to retrieve the original message in accordance with the methods described in this disclosure.

Both the sending device 202 and the receiving device 204 also include and/or have access to one or more libraries 206 that include text strings associated with appropriate code words, indexes, addresses, or the like.

In an embodiment, the text strings of the library may be organized as an associative memory (e.g., a look up table) that encodes text strings (words, phrases, sentences, or any other text string) according to the address locations (i.e., index) of data entries contained within the memory. For example, each entry (i.e., text string) in a library is associated with a unique index (L(i)) in the library.

In general, the library entries may be adapted for specific applications. The unique text strings stored in the library may therefore include any kind of characters including alphanumeric characters, symbols, graphics characters, spaces, punctuation marks, control codes, or the like. A text string entry of the library may include one or more words. As used herein, a "word" is any string of alphanumeric characters delimited by non-word characters (e.g., space, punctuation, or the like). Designation of characters as word characters or non-word characters is predetermined. However, the compression and reconstruction methods described herein do not rely on any specific characters being in either set, so long as the two sets are mutually exclusive and predefined. As used herein, a "phrase" is a collection of one or more words delimited by one or more non-word characters. As such, the entries of the library may either be a single word, or a phrase that includes two or more words. It is not necessary that text strings included in the library are English words/phrases or even words/phrases recognizable as such to human readers. For example, common domain names used in links that can be frequently included in text messages can be recognized by the system described herein as a word or a phrase. The following discussion describes a library that includes text strings that are single words associated with an index. However, as discussed above, the disclosure is not so limiting and other types of text strings may be included in a library.

A library may be created by mapping each text string (e.g., words) into a unique index L(i) in the library using mapping techniques such as, without limitation, a hash function (although other mapping techniques known to those skilled in the art may be employed). As described below, for a given text string, the compression module 221 will output (as a code word) the library index number L(i) corresponding to that text string.

It will be appreciated that the compression and reconstruction operations conducted at the respective sending and receiving devices 202/204 are accomplished by the use of a common library (i.e., the same library) which is critical for proper compression and reconstruction as described below. In an embodiment, a library may be customized for specific uses so as to include a set of text strings that are used frequently for a particular environment or by a group of intended users which are utilizing the sending and receiving devices 202/204. For example, in a military setting where the sending and receiving devices 202/204 may be used for communication during an armed operation, the military personnel may employ a vocabulary of only about two or three thousand words, and the words, phrases, and/or sentences that occur frequently are fairly limited, and each of these frequently occurring words, phrases and/or sentences may be included in the library as text strings and associated with a unique library index. In an embodiment, the library may be created automatically by identifying common text strings recognized in previously processed messages, and/or text strings recognized in messages stored in a historical message database or simulation settings for that environment using any now or hereafter known methods. Alternatively and/or additionally, a user may create a library by including the most commonly used text strings for a situation and/or an environment). The library may be updated periodically, automatically and/or by a user In certain embodiments, the maximum size (i.e., number of entries L(i)) of the library may be predefined. Therefore, the maximum number of bits of information needed to represent any index in the library is also known. For example, if the maximum dictionary size is 8000 entries, only 13 bits are needed to represent any index number. Another example would be that 12 bits are needed for a 4000 word main dictionary (num_bits=log(table size)/log(2), rounded up).

In an embodiment, the index representing a text string in the library can be compressed by using only a predefined number of least significant bits of the index to replace the text string during compression, and using a cyclic redundancy check (CRC) for checking the validity of the reconstructed text strings, as described below. For example, if the library includes "n" number of words and is arranged to have "m" tables with "n/m" words included in each table, a location in each of the "m" tables may be represented by the same index value. The CRC provides a way for identifying the correct table and word without increasing the size of the index to identify the table. Specifically, the CRC provides a way to distinguish which tables were used for compression by testing all possible tables for all possible words in a sub-block of a compressed message (discussed below).

Both the sending device 202 and the receiving device 204 may also include and/or have access to a rule set 208 that includes one or more rules associated with compression and/or reconstruction of a message. In an embodiment, the rule set 208 may be included in a library 206. Ruleset 208 can be manually and/or automatically generated. For example, the rule set may include codes indicating various grammatical constructs, formats, etc. for text strings (e.g., plural forms, verb tense, leading capital letters, all capital letters, small letters, or the like) as discussed below. Alternatively and/or additionally, the rule set may include other rules that govern both compression and reconstruction (e.g., placement position and length of the CRC, or other fields in a compressed message; type of encoding to be used for words not found in the library; number of bits in each field of a compressed message; number of least significant bits of the index used in the compressed message; the like).

FIG. 3 illustrates a sample rule set 300 used for compression and reconstruction, according to an embodiment. The rule set 300 specifies the placement of different fields in a message, the size of the fields, and various codes associated with grammatical constructs and formats.

In an embodiment, the library 206 and/or the rule set 208 are known ahead of time by both sending device 202 and receiving device 204. For example, a user of sending device 202 may have defined a library that is shared with the receiving device 204. Alternatively and/or additionally, the library may be made available for download or access from a server or other form of public repository. In certain embodiments, sending device 202 may transmit a compressed text message, along with the rule set used for compressing the text message to the receiving device 204. Receiving device 204 may then use the received library and/or rule set to retrieve the original text message from the compressed message, and/or reverse the effects of any compressive transformation rules applied to the original text message to yield at least an approximation to the original message.

It will be understood to those skilled in the art that while this disclosure uses indexes representing the address of a text string in a library for compression, other suitable forms of codes may be used without deviating from the principles of this disclosure. For example, they may be in the form of a "n" digit alphanumeric code that is predefined. For example, two digit alphanumeric codes may be used to represent over 1000 text strings. Therefore, by use of standardized formats including alphanumeric codes, varieties of codes can be stored in a library according to embodiments of the present invention.

The compression module 221 also includes a cyclic redundancy check (CRC) encoder 222 configured to calculate a CRC code. The CRC code may be used for error detection, and each block of text strings (or message) includes a CRC code with its compressed data. A CRC code may thus be used for further compressing the indexes associated with the text strings in a library by allowing the reconstruction module 241 to determine with fairly high accuracy if the reconstructed message bits are correct. The CRC code bits to send can be calculated by the CRC encoder 222 using any now or hereafter known methods. Most rely on a feedback register architecture where the entire uncompressed message (or sub-block of message) to be compressed is passed into the register, and the final CRC bits used is the state of the register at the conclusion of the process. In other words, a CRC code is calculated on the basis of a generating polynomial Standard sizes for CRC codes used are 32, 24, 16 and 8 bits. Other sizes may also be used.

The CRC encoder 222 may include a shift type register. A register is a semiconductor device that is used for storing several bits of digital data. It basically includes a set of flip-flops, with each flip-flop representing one bit of the register. Thus, an n-bit register has n flip-flops. A basic register is also known as a "latch." A special type of register, known as the shift register, is used to pass or transfer bits of data from one flip-flop to another. This process of transferring data bits from one flip-flop to the next is known as "shifting." Shift registers are useful for transferring data in a serial manner while allowing parallel access to the data. A shift register is simply a set of flip-flops interconnected in such a way that the input to a flip-flop is the output of the one before it. Clocking all the flip-flops at the same time will cause the bits of data to shift or move toward the last flip-flop. A shift-register can also be implemented in software or a computer or Field Programmable Gate Array (FPGA) as would be appreciated by those skilled in the art.

In an example embodiment, the CRC encoder 222 may generate a CRC code using an M state feedback shift register. The flip-flops of the feedback shift register are placed in a known state and the N message bits are shifted into the structure. The input bits are added (exclusive-or'd) with several of the bits of the shift register, for example. The result is shifted into the shift register. The M bit state of the feedback shift register, after all message bits have been shifted into it is known as the CRC code or CRC bits and can be transmitted along with the compressed message bits to provide error detection capability. Those skilled in the art will appreciate that other techniques for generating the CRC code may also be used.

The reconstruction module 241 of the receiving device 204 may also include a CRC encoder 242. The CRC encoder is similar or equivalent to the CRC encoder 222. For example, at the CRC encoder 242, the reconstructed message bits and appended CRC bits are processed by an equivalent shift register based device. The resulting state of the receive shift register will be all zeros if there are no errors in the reconstruction of the message. Another method to determine CRC errors is to simply shift the N message bits through shift register and then Xor with the received M CRC bits. Of course, other techniques may also be available as would be appreciated by the skilled artisan.

In other words, a CRC code over an uncompressed text string or message is calculated at the compression module CRC encoder 222 and that CRC code is transmitted along with the compressed text string. Once the compressed text string is reconstructed at the reconstruction module, a new CRC code is calculated over the full reconstructed text string at the CRC encoder 242. This new CRC code is then compared to the included CRC to see if there is a match, which means the reconstructed text string is correct.

In general, a long CRC provides higher reliability, but lower compression efficiency. A short CRC, on the other hand, provides higher compression efficiency, but lower reliability. The present invention advantageously provides a CRC that has high reliability, yet does not unnecessarily compromise compression efficiency. In accordance with the invention, a CRC is pre-verified at the compressor before it is sent to the reconstructor. The pre-verification ensures that the CRC is of sufficient length to be able to accurately resolve which words of a library were compressed based on the compressed indexes, but is not unnecessarily lengthy.

Figure 4:
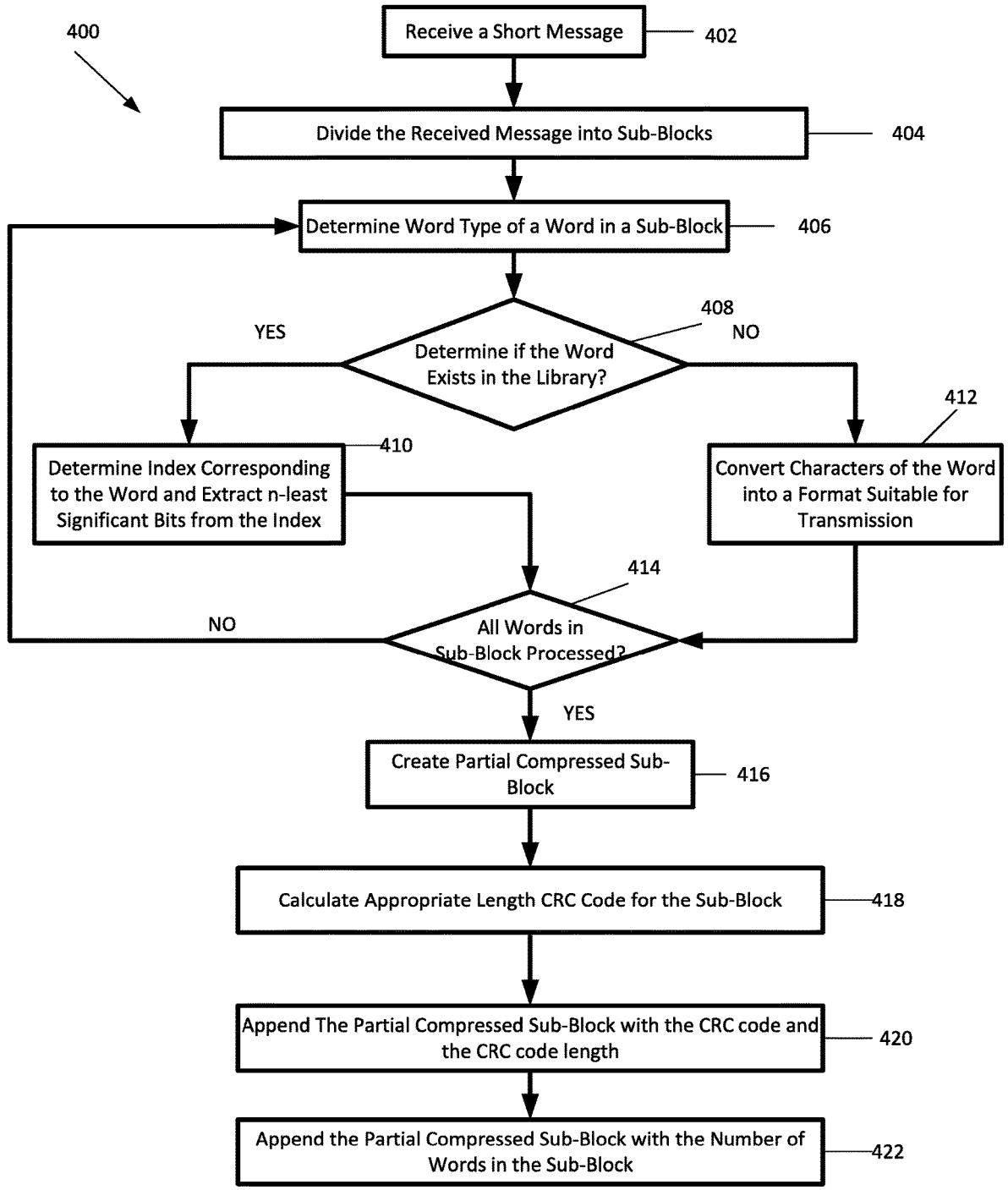
FIG. 4 is a flowchart illustrating an example method of compressing a short message, according to an embodiment.

FIG. 4 is a flowchart illustrating an example method of compressing a short message according to an embodiment. While the message compression method 400 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 4, but the process may be integrated and/or one or more steps may be performed together, or the steps may be performed in the order disclosed or in an alternate order.

At 402, a sending device may receive a short message to be transmitted to a receiving device, via, for example, user input. The short message may be, for example, a text that includes up to 180 words.

At 404, the sending device may divide the received message into sub-blocks of "n" text strings or less, for encoding and compression, where the format of the text strings corresponds to that of the library. For example, if the library includes single words, the sub-blocks include up to "n" single words; if the library includes phrases of "m" words, the sub-blocks include up to "n" phrases of "m" words, or the like. For the ease of description, for the subsequent disclosure, it is assumed that the library includes single words; however, the disclosure is not so limiting and similar principles can be applied for compressing messages when the library includes phrases, sentences, etc. In an embodiment, "n" may be determined so as to reduce processing required for decoding the compressed message at the receiving device and may be an integer value such as, without limitation, 5, 6, 7, 8, 9 . . . or the like. In an embodiment, "n" may be equal to 7. The sending device may compress each sub-block as described below in steps 406-422.

At 406, for each sub-block of "n" words, the sending device may determine a word type for each word in the sub-block, and identify a code that represents the word type. In an embodiment, a word type may be indicative of one or more characteristics of the word. The word type is determined in order to identify a representative code from, for example, the rule set, that may be included in the compressed data set for providing information about such characteristics to the decoding device or system. This is useful in reducing the size of the library used for compressing and reconstructing the message since a single index code may be mapped to a default word, and the code representing the characteristics of the word may provide additional information about different characteristics of the word in a message during compression and reconstruction. Examples of the characteristics may include, without limitation, all capital letters, leading capital letter, different fonts, plural, singular, exclamation or other punctuation appended to the word, tense of a word, other grammatical constructs, etc. In another example, if the "word" is a phrase, then the characteristics may correspond to the number of words in the phrase, characteristics of individual words in the phrase, or the like.

For example, a first code may be used to represent that a word is plural, and a second code may be used to represent that the same word is singular, while the library code index may be used to represent the default word itself. Alternatively and/or additionally, a code may be used to represent that a word is plural and absence of a code may represent a default singular characteristic, or vice versa. Capitalization may be handled similarly. For example, a word including a leading capital letter may be associated with a first code, a word including all capital letters may be associated with a second code, and a word including no capital letters may be associated with a third code, while the library code index may be used to represent the default word itself. Alternatively and/or additionally, absence of a code may represent a default characteristic (e.g., all small letters). Other characteristics may similarly be represented by one or more codes. During compression, the word will be changed to a default state (example, all small letters and/or singular) for identifying the index code representing the word in the library, and the appropriate index code from the library will be written for generating the compressed word. In an embodiment, different characteristics may be associated with different codes. Alternatively and/or additionally, one or more characteristics may be associated with the same code. For example, leading capital and singular words may be represented by a first code, leading capital and plural words may be represented by a second code, all capital and singular words may be represented by a third code, all capital and plural words may be represented by a fourth code, all small and plural words may be represented by a fifth code, and all small and singular words may be represented by a sixth code (or a default no code).

At 408, for each word in a sub-block, the sending device may search the library to determine if the word exists in the library. As discussed above, the word may be changed to a default state to determine if the word exists in the library. Here, default word or default state refers to the format of the words that exists in the library. For example, all the words in the library may be singular, small letter, and/or present tense forms. Thus, if a sub-block includes the word "DOGS", the sending device may search the library for a default word "dog". In one embodiment, the sending device may search the library for a matching word therein by comparing each entry in the library to the input word under consideration using any now or hereafter known methods. For example, the sending device may use matching algorithms such as a hash table to perform the search.

If the sending device determines that the word exists in the library (408: YES), the sending device may determine the index (i.e., the code) associated with the default word, and extract "n" least significant bits of the index that can be used replace the word in the sub-block (410). In an embodiment, "n" may be predetermined based on, for example, the processing capabilities of the receiving device, the size of the library, the desired compression ratio, available bandwidth, etc., or a combination thereof.

However, if the sending device determines that the word does not exist in the library (408: NO), the sending device may convert the characters of the word into a format suitable for transmission to the receiving device (e.g., ASCII bits) corresponding to the characters, without compression (412). Alternatively, the sending device may use Huffman encoding or other encoding techniques to encode the word.

The sending device may then determine if all the words in the sub-block have been processed (414). If all the words have not been processed, the sending device determines the word type for the next word in the sub-block. In other words, the sending device repeats the above steps from 404-412 until all the words in a sub-block have been processed.

If all the words have been processed, at 416, the sending device may create a partial compressed sub-block. For each word in the sub-block that has a matching entry in the library, the sending device replaces that word with the corresponding n-least significant index bits extracted in step 410. The sending device also appends the n-least significant index bits of each word with a code representing the word type (from step 406). For each word in the sub-block that does not have a matching entry in the library, the sending device replaces that word with the corresponding ASCII bits (or other code from step 412). The sending device also appends the ASCII bits with a code indicating that a library was not used to compress the word as well as a character count of the word. Each of these fields may have a predefined bit size. The code representing the word type or that a library was not used for compressing the word may be added before or after the n-least significant index bits or the ASCII bits. The position rules may be defined in the rule set.

The sending device may then calculate an appropriate length CRC code for each sub-block (418). As discussed above, a compressed sub-block only includes the "n" least significant index bits relating to the words in the sub-block. Reconstructing or decompressing the sub-block from the compressed sub-block may include multiple hypothesis relating to the higher order bits of the code (such as trial and error), and the CRC code may be used to verify the reliability of such reconstruction. For example, if there are about 8000 entries in a library (i.e., 13 bits), the sending device may only use 10 least significant bits for compression. During reconstruction, the receiving device may then try all possible variations of the remaining bits (e.g., a 5 word message will have 8*8*8*8*8 combinations to try), and may determine the correct combination using the CRC code associated with the message sub-block. Specifically, for an 8000 word library arranged to include 8 tables of 1000 words each, a 10 bit index may be used to identify the location or word in a table. However, the index does not identify which table was used to compress each word. As such, the receiving device needs to determine which 1000-word table was used for compressing each word by testing 8 possible tables for each word in a sub-block. Hence, the sending device may compute a CRC using the actual words in the reduced-size tables of the library, and a CRC length is selected to ensure that only the right N words in the right N tables will yield the correct CRC value that was added to message upon reconstruction. So assuming 5 words, there are 8*8*8*8*8 possibilities that need to be explored to find the right 5 words (or phrases) which match the CRC value sent in a compressed message (discussed below).

In an embodiment, for calculating the CRC code, the sending device first calculates a smallest length CRC code (e.g., 8-bit) based on the uncompressed sub-block, and pre-verifies it to determine if the CRC code will lead to a proper decoding of the sub-block. The sending device may perform the pre-verification by calculating a CRC code for an uncompressed sub-block, compressing the sub-block as discussed above, reconstructing the sub-block from the compressed sub-block, calculating a new CRC code over the full reconstructed sub-block, and comparing the new CRC code to the original CRC code to determine if there is a match. This may be performed for all possible combinations (e.g., 8*8*8*8*8 possibilities in the above example). If the pre-verification fails (i.e., the new CRC code does not match the original CRC code and/or the new CRC code matches the original CRC code for an inaccurate reconstruction or wrong words), the sending device then calculates a new CRC code that is longer than the earlier length (e.g., 16-bit, 24-bit, or 32-bit) and performs the pre-verification again. This is repeated until a CRC length that leads to a proper decoding or reconstruction is determined.

At 420, once an appropriate length has been calculated, the sending device appends the partial compressed sub-block with the CRC code, and the type or length of the CRC code (in any order). This may be added at the beginning, or at the end of the partial compressed sub-block. If the CRC code and the CRC code type are appended at the end of a sub-block, the CRC code bits are followed by the CRC code type bits. However, if the CRC code and the CRC code type are appended before a sub-block, the CRC code bits are added after the CRC code type bits. It should be noted that the type or length of the CRC code is a fixed length 2-bit field that can be a code (e.g., 00, 01, 10, or 11) representing whether the CRC code is an 8-bit, 16-bit, 24-bit, or 32-bit field.

Finally, the sending device also appends (422) the partial compressed sub-block with the total number of words in the original sub-block to create a compressed sub-block of a message that is ready for transmission to the receiving device. This may be added at the beginning or at the end of the compressed sub-block. It should be noted that the number of words in a sub-block is a fixed length field depending on the maximum number of words in a sub-block. For example, the word count is a 3-bit field for a sub-block that includes 8 words or less.

The system repeats the steps 406-422 until all the sub-blocks of the message have been compressed as discussed above. Once all the sub-blocks have been compressed, the sending device may transmit the message to a receiving device. The message may include a header, tag, and/or other information bits that include meta-information about the message, such as without limitation, number of sub-blocks included in the message, number of words in each sub-block, identification of starting and/or ending bits of one or more sub-blocks, or the like. This information may be included at the beginning of the message, at the end of the message or at other known positions within the message. The message may also include information identifying various fields in each compressed sub-block of the message. Alternatively and/or additionally, each sub-block may be sent or transmitted separately to a receiving device. Each sub-block may be associated with a preamble, header, or the like that identifies the sub-blocks as being part of a bigger message, the order in which the sub-block appear in the message, total number of sub-blocks in the message, total number of words in each sub-block, or other such information.

Figure 5:
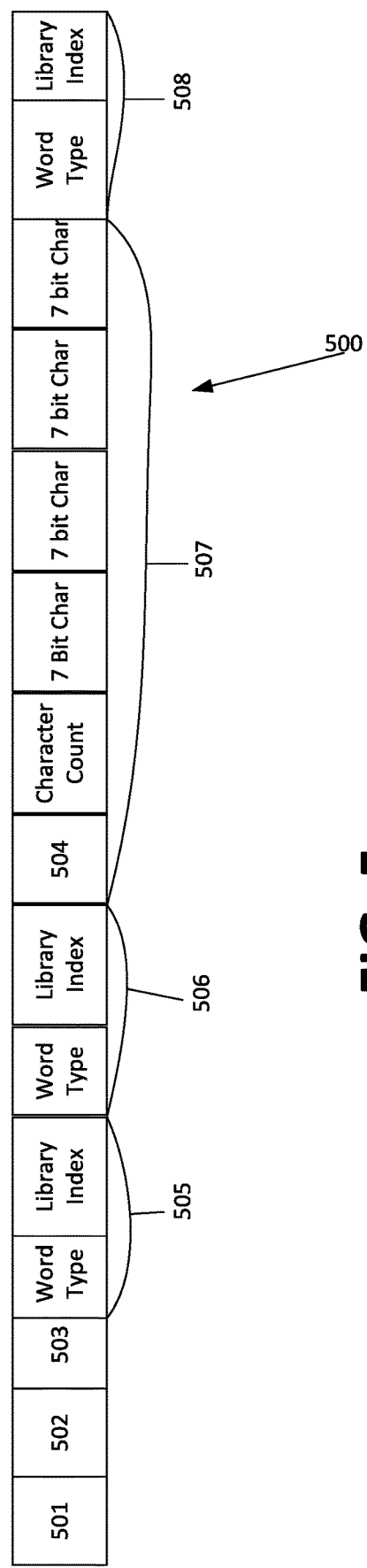
FIG. 5 illustrates an example compression format for a sub-block of message, according to an embodiment.

FIG. 5 illustrates an example compressed sub-block of message 500 that includes 4 words (505, 506, 507, and 508) out of which one word (507) did not have a match in the library. Words 505, 506, and 508 are replaced by a word type code followed by their corresponding library index. Word 507 is replaced by a code 504 indicating that the word was not compressed using a library, the character count and the ASCII 7-bit character codes for each character in the word. The compressed sub-block 500 also includes the word count (501), the CRC size (502), and the CRC (503) appended at the beginning of the sub-block. While FIG. 5 illustrates that the word count (501), the CRC size (502), and the CRC (503) are appended at the beginning of the compressed sub-block, one or more of these field can be appended at the end or any other suitable location in the sub-block (as long as the position is known to the receiving device—for example the position may be included in the rule set 208).

Figure 6:
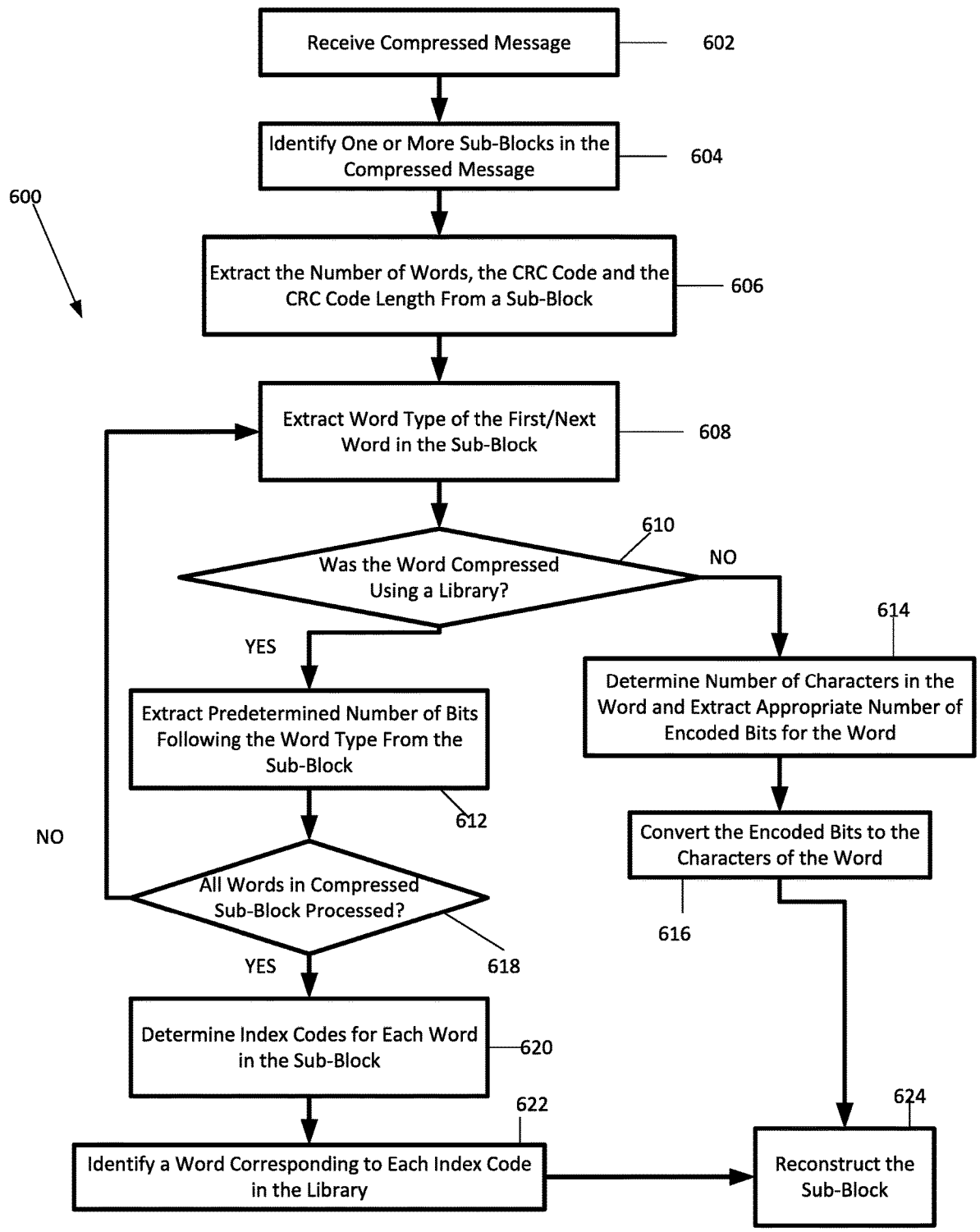
FIG. 6 is a flowchart illustrating an example method of reconstruction of a compressed short message, according to an embodiment

FIG. 6 is a flowchart illustrating an example method of reconstructing a compressed short message according to an embodiment. While the message reconstruction method 600 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 6, but the process may be integrated and/or one or more steps may be performed together, or the steps may be performed in the order disclosed or in an alternate order.

At 602, the receiving device may receive a compressed message. The receiving device may then identify (604) one or more sub-blocks in the compressed message. The receiving device may identify the one or more sub-blocks, based on the meta information included in the message.

Upon identification of the sub-blocks, the receiving device may extract from each sub-block (606), the number of words in the sub-block, the CRC code, and the CRC code length based on their predetermined position and order (for example, based on the rule set. For example, for the compressed sub-block shown in FIG. 5 that includes 5 words, the receiving device may use the first three bits of the compressed sub-block to determine the number of words in the sub-block and the next two bits to determine the length of the CRC. Finally, depending on the determined length of the CRC, the receiving device may extract the appropriate bits representing the CRC following the CRC length field (or before the CRC length field).

At 608, the receiving device may extract the word type of the first word in the compressed sub-block. The receiving device may then analyze (610) the word type using the rule set to determine whether the associated word was compressed using the library. If the receiving device determines that the corresponding word was compressed using the library (610: YES), receiving device may extract a predetermined number of bits following the word type code bits that represent the n-least significant bits for the index code for that word (612). However, if the receiving device determines that the word was not compressed using the library (610: NO), the receiving device may use the character count field to determine the number of characters in the word and extract the appropriate number of ASCII bits (or bits encoded using, for example Huffman encoding) that represent the word (614). The receiving device may use now or hereafter known decoding methods to convert the ASCII bits to the corresponding word (616).

The receiving device may perform steps 608-614 until all the words (determined based on the number of words field) in the sub-block have been processed sequentially by determining whether all the words have been processed in the sub-block (618). If all the words have been processed and the n-least significant index bits for all the words in the sub-block that were compressed using a library have been extracted, the receiving device may execute various hypothesis to determine the remaining bits of each word's index code, to determine the index code for each word in the sub-block (620). The receiving device may use the extracted CRC code to check the validity of the hypothesis.

The receiving device may then identify a word corresponding to each index code in the library at the library address that corresponds to the index (622). At 624, the receiving device may reconstruct the original sub-block by replacing the n-least significant index bits with the identified words and/or the encoded ASCII bits with the word characters. The receiving device may output the reconstructed message to a user, via for example a display device, microphone or other user interface of the receiving device.

The systems described herein can comprise one or more components such as a processor, an application specific circuit, a programmable logic device, a digital signal processor, or other circuit programmed to perform the functions described herein. The system can be realized in one computer system or several interconnected computer systems. Any kind of computer system or other apparatus adapted for carrying out the methods described herein is suited. A typical combination of hardware and software can be a general-purpose computer system. The general-purpose computer system can have a computer program that can control the computer system such that it carries out the methods described herein.

Computer systems as referenced herein can comprise various types of computing systems and devices, including a server computer, a personal computer (PC), a laptop computer, a desktop computer, a network router, switch or bridge, or any other device capable of executing a set of instructions (sequential or otherwise) that specifies actions to be taken by that device.

Figure 7:
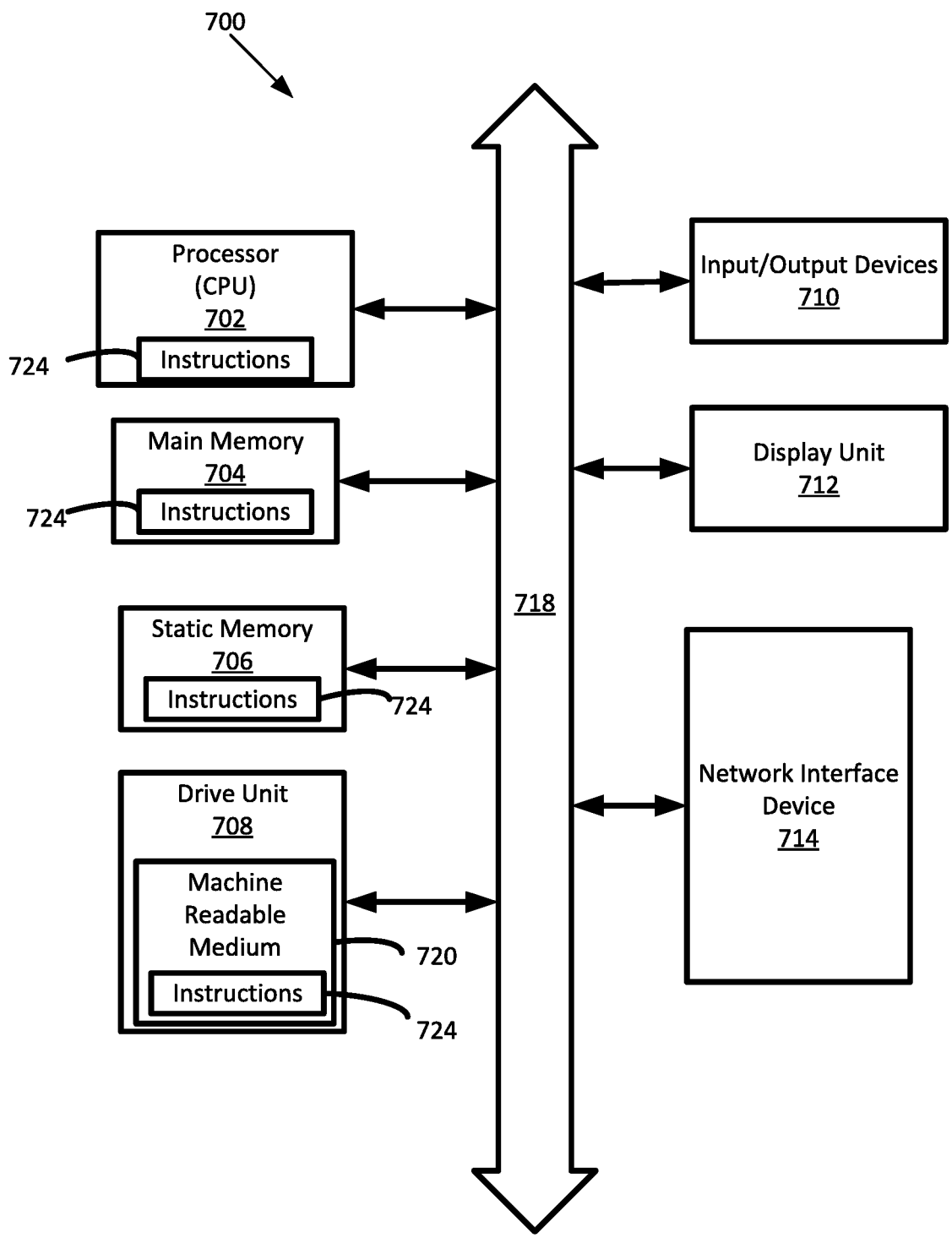
FIG. 7 is a block diagram of an exemplary computer system that can perform processing operations as described herein for purposes of implementing an overlay network.

Referring now to FIG. 7, there is shown a hardware block diagram comprising an exemplary computer system 700. The machine can include a set of instructions which are used to cause the computer system to perform any one or more of the methodologies discussed herein. In a networked deployment, the machine can function as a server or a router. In one or more scenarios, the exemplary computer system 700 can correspond to, for example, the sending device 202, the receiving device 204, or any other computing device. In some scenarios, the computer 700 can operate independently as a standalone device. However, the disclosure is not limited in this regard and in other scenarios the computer system can be operatively connected (networked) to other machines in a distributed environment to facilitate certain operations described herein. Accordingly, while only a single machine is illustrated it should be understood that in other scenarios the system can be taken to involve any collection of machines that individually or jointly execute one or more sets of instructions as described herein.

The computer system 700 is comprised of a processor 702 (e.g. a central processing unit or CPU), a main memory 704, a static memory 706, a drive unit 708 for mass data storage and comprised of machine readable media 720, input/output devices 710, a display unit 712 (e.g. a liquid crystal display (LCD), a solid state display, or a cathode ray tube (CRT)), and a network interface device 714. Communications among these various components can be facilitated by means of a data bus 718. One or more sets of instructions 724 can be stored completely or partially in one or more of the main memory 704, static memory 706, and drive unit 708. The instructions can also reside within the processor 702 during execution thereof by the computer system. The input/output devices 710 can include a keyboard, a mouse, a multi-touch surface (e.g. a touchscreen) and so on. The network interface device 714 can be comprised of hardware components and software or firmware to facilitate wired or wireless network data communications in accordance with a network communication protocol utilized by a data network 100.

The drive unit 708 can comprise a machine readable medium 720 on which is stored one or more sets of instructions 724 (e.g. software) which are used to facilitate one or more of the methodologies and functions described herein. The term "machine-readable medium" shall be understood to include any tangible medium that is capable of storing instructions or data structures which facilitate any one or more of the methodologies of the present disclosure. Exemplary machine-readable media can include magnetic media, solid-state memories, optical-media and so on. More particularly, tangible media as described herein can include; magnetic disks; magneto-optical disks; CD-ROM disks and DVD-ROM disks, semiconductor memory devices, electrically erasable programmable read-only memory (EEPROM)) and flash memory devices. A tangible medium as described herein is one that is non-transitory insofar as it does not involve a propagating signal.

Computer system 700 should be understood to be one possible example of a computer system which can be used in connection with the various implementations disclosed herein. However, the systems and methods disclosed herein are not limited in this regard and any other suitable computer system architecture can also be used without limitation. Dedicated hardware implementations including, but not limited to, application-specific integrated circuits, programmable logic arrays, and other hardware devices can likewise be constructed to implement the methods described herein. Applications that can include the apparatus and systems broadly include a variety of electronic and computer systems. In some scenarios, certain functions can be implemented in two or more specific interconnected hardware modules or devices with related control and data signals communicated between and through the modules, or as portions of an application-specific integrated circuit. Thus, the exemplary system is applicable to software, firmware, and hardware implementations.

Further, it should be understood that embodiments can take the form of a computer program product on a tangible computer-usable storage medium (for example, a hard disk or a CD-ROM). The computer-usable storage medium can have computer-usable program code embodied in the medium. The term computer program product, as used herein, refers to a device comprised of all the features enabling the implementation of the methods described herein. Computer program, software application, computer software routine, and/or other variants of these terms, in the present context, mean any expression, in any language, code, or notation, of a set of instructions intended to cause a system having an information processing capability to perform a particular function either directly or after either or both of the following: a) conversion to another language, code, or notation; or b) reproduction in a different material form.

Reference throughout this specification to features, advantages, or similar language does not imply that all of the features and advantages that may be realized should be or are in any single embodiment. Rather, language referring to the features and advantages is understood to mean that a specific feature, advantage, or characteristic described in connection with a particular implementation is included in at least one embodiment. Thus, discussions of the features and advantages, and similar language, throughout the specification may, but do not necessarily, refer to the same embodiment.

Furthermore, the described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

Reference throughout this specification to "one embodiment", "an embodiment", or similar language means that a particular feature, structure, or characteristic described in connection with the indicated embodiment is included in at least one embodiment. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for reconstructing a compressed short message, comprising, by a processor:
    receiving a compressed short message, the message comprising a plurality of fields;
    dividing the compressed short message into one or more sub-blocks;
    for each of the one or more sub-blocks:
        a) identifying positions of a number of text strings field, a cyclic redundancy check (CRC) code length field, and a CRC code field in that sub-block,
        b) extracting, from that sub-block, the CRC code length and the number of words (m) based on the identified positions,
        c) extracting, from that sub-block, the CRC code,
        d) extracting, from that sub-block, a first code representing a text string type of a text string following the first code,
        e) analyzing the first code to determine whether the text string was compressed using a library,
        f) upon determining that the text string was compressed using a library, extracting, from that sub-block, a predetermined number of least significant bits representative of an index corresponding to the text string in the library,
        g) using the CRC code to determine the index, and
        h) using the index to replace the predetermined number of least significant bits representative of the index in that sub-block with the text string.

2. The method according to claim 1, further comprising upon determining that the text string was not compressed using a library, identifying a number of characters in the text string and decoding the text string.

3. The method according to claim 2, further comprising repeating the steps (d)-(h) "m" number of times to create a reconstructed message.

4. A system for reconstructing a compressed short message, the system comprising: a processor, and a non-transitory computer-readable storage medium comprising one or more programming instructions that, when executed, will cause the processor to:
    receive a compressed short message, the message comprising a plurality of fields;
    divide the compressed short message into one or more sub-blocks;
    for each of the one or more sub-blocks:
        a) identify positions of a number of text strings field, a cyclic redundancy check (CRC) code length field, and a CRC code field in that sub-block,
        b) extract, from that sub-block, the CRC code length and the number of words (m) based on the identified positions,
        c) extract, from that sub-block, the CRC code,
        d) extract, from that sub-block, a first code representing a text string type of a text string following the first code,
        e) analyze the first code to determine whether the text string was compressed using a library,
        f) upon determining that the text string was compressed using a library, extracting, from that sub-block, a predetermined number of least significant bits representative of an index corresponding to the text string in the library,
        g) use the CRC code to determine the index, and h) use the index to replace the predetermined number of least significant bits representative of the index in that sub-block with the text string.

5. The system according to claim 4, further comprising programming instructions that, when executed, will cause the processor to, for each of the one or more sub-blocks, upon determining that the text string was not compressed using a library, identify a number of characters in the text string and decoding the text string.

6. The system according to claim 5, further comprising programming instructions that, when executed, will cause the processor to repeat the steps (d)-(h) "m" number of times to create a reconstructed message.

* * * * *